(12) United States Patent
Biwa et al.

(10) Patent No.: US 6,623,560 B2
(45) Date of Patent: Sep. 23, 2003

(54) CRYSTAL GROWTH METHOD

(75) Inventors: Goshi Biwa, Kanagawa (JP); Hiroyuki Okuyama, Kanagawa (JP); Masato Doi, Kanagawa (JP); Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/907,215

(22) Filed: Jul. 17, 2001

(65) Prior Publication Data
US 2002/0043208 A1 Apr. 18, 2002

(30) Foreign Application Priority Data

Jul. 18, 2000 (JP) ................ P2000-217911

(51) Int. Cl.⁷ ............................. C30B 25/04
(52) U.S. Cl. ............................. 117/95
(58) Field of Search ............... 117/88, 95, 97; 438/712

(56) References Cited

U.S. PATENT DOCUMENTS

| 6,015,979 A | * | 1/2000 | Sugiura et al. | ........... 257/86 |
| 6,316,785 B1 | * | 11/2001 | Nunoue et al. | ........... 257/14 |
| 6,447,604 B1 | * | 9/2002 | Flynn et al. | ........... 117/89 |

FOREIGN PATENT DOCUMENTS

| JP | 07066366 | 3/1995 |
| JP | 11130597 | 5/1999 |
| JP | 11162847 | 6/1999 |
| JP | 11251253 | 9/1999 |

OTHER PUBLICATIONS

US 6,436,188, 8/2002, Koike et al. (withdrawn)*
T. Wang, et al., A New Method for a Great Reduction of Dislocation Density in a GaN Layer Grown on a Sapphire Substrate, Tokushima Univ., SVBL, Department of Electrical and Electronic Engineering, 28p–YQ–3.
H. Lahreche, et al., Growth of High–Quality GaN by Low–Pressure Metal–Organic Vapour Phase Epitaxy (LP–MOVPE) from 3–D Islands and Lateral Overgrowth, Journal of Crystal Growth, 205 (1999) 245–252.

* cited by examiner

Primary Examiner—Benjamin L. Utech
Assistant Examiner—Matthew Anderson
(74) Attorney, Agent, or Firm—Sonnenschein, Nath & Rosenthal

(57) ABSTRACT

A crystal growth method includes forming a mask layer capable of impeding crystal growth on a substrate in such a way a first nitride semiconductor layer has irregularities at a surface thereof exposed at a window region opened at a part of the mask layer, and growing a second nitride semiconductor layer over a region including the surface of the mask layer through crystal growth from the irregularities. Through-type dislocations can be reliably prevented from propagation due to the discontinuity of crystals at the irregularities and also to lateral crystal growth.

12 Claims, 10 Drawing Sheets

CRYSTAL GROWTH METHOD

The present application claims priority of Japanese Application No. P2000-217911 filed Jul. 18, 2000, which application is incorporated herein by reference to the extent permitted by law.

BACKGROUND OF THE INVENTION

This invention relates to a crystal growth method adapted for use in the formation of semiconductor light-emitting devices and more particularly, to a crystal growth method wherein selective crystal growth of a nitride semiconductor is carried out.

Owing to the absence of either a lattice-matching substrate or a substrate of a low dislocation density in the vapor phase growth technology of a gallium nitride compound semiconductor, there is known a technique wherein after deposition of a buffer layer of AlN or $Al_xGa_{1-x}N$, in which $0 \leq x < 1$, on a substrate such as of sapphire at a low temperature of 900° C. or below, a gallium nitride compound semiconductor is grown to reduce the number of dislocations ascribed to the lattice-mismatching. Such a technique is, for example, described in Japanese Patent Laid-open No. Sho 63-188938 and Japanese Patent Publication No. Hei 8-8217. Using the technique of reducing the dislocations in number, the gallium nitride compound semiconductor can be improved in crystallinity and morphology.

For obtaining high-quality crystals of a low dislocation density, there is a technique wherein after deposition of a first gallium nitride compound semiconductor (i.e. a first layered) on a substrate, a protective layer made of a material of impeding the growth of the gallium nitride compound semiconductor, e.g. silicon oxide or silicon nitride, is formed, followed by growth of a second (i.e. second-layered) gallium nitride compound semiconductor in in-plane directions (or in lateral directions) from a region not covered with the protective layer, thereby impeding the propagation of through-type dislocations extending vertically from the interface of the substrate. Such a technique is disclosed, for example, in Japanese Patent laid-open No. Hei 10-312971. A similar technique is described, for example, in MRS Internet J. Nitride Semicond. Res. 4S1, G3, 38 (1999). In the technique, after a first gallium nitride compound semiconductor layer has been once grown, the layer is selectively removed by use of a reactive ion etching (hereinafter referred to as RIE) device. Thereafter, a second gallium nitride compound semiconductor layer is selectively grown from the crystals left in the growth device, thereby reducing the through-type dislocation density. When using these techniques, there can be obtained a crystal film having a dislocation density up to about $10^6$ cm$^{-2}$, thereby realizing a prolonged life of a semiconductor laser.

However, the use of only these techniques using the low temperature buffer layer enables one to reduce the through-type dislocations, at most, to a level of about $10^9$ cm$^{-2}$, thus placing a limitation on the formation of a high-quality gallium nitride compound semiconductor. These dislocations worsen the performance and life of the resultant semiconductor device.

With the technique wherein re-growth is effected after the formation of a protective film on the above-mentioned first gallium nitride compound semiconductor layer or after the selective removal of the first gallium nitride compound semiconductor layer such as by reactive ion etching, the through-type dislocations left in the crystals remaining in a region where no protective film is formed or after the removal are propagated in the crystals of the second gallium nitride compound semiconductor layer, thus placing the limitation on a low dislocation density.

SUMMARY OF THE INVENTION

It is accordingly an object of the invention to provide a crystal growth method which can overcome the problems involved in the prior art.

It is another object of the invention to provide a crystal growth method which ensures the formation of high-quality crystals of a low dislocation density in a vapor phase growth technique of a gallium nitride compound semiconductor.

The above objects can be achieved, according to a first aspect of the invention, by a crystal growth method, which comprises forming a first nitride semiconductor layer on or over a substrate, forming a mask layer, which is capable of impeding crystal growth and has a window region opened at part thereof, on the first nitride semiconductor layer in such a way that the first nitride semiconductor layer has irregularities at a surface portion thereof exposed at the window region, and growing a second nitride semiconductor layer through crystal growth from the irregularities over a region including an upper surface of the mask layer.

According to a second aspect of the invention, there is provided a crystal growth method, which comprises forming a first nitride semiconductor layer over or on a substrate, forming a mask layer, which is capable of impeding crystal growth and has a window region opened at part thereof, on the first nitride semiconductor layer in such a way that the first nitride semiconductor layer has a growth-impeding surface having fine pores or pinholes at a surface portion thereof exposed at the window region, and growing a second nitride semiconductor layer through crystal growth from the fine pores over a region including an upper surface of the mask layer.

According to a third aspect of the invention, there is provided a crystal growth method, which comprises forming a first nitride semiconductor layer over or on a substrate, forming a mask layer, which is capable of impeding crystal growth and has a window region opened at part thereof, on the first nitride semiconductor layer in such a way that the first nitride semiconductor layer has a crystal nucleus region serving as crystal nuclei for crystal growth at a surface portion thereof exposed at the window region, and growing a second nitride semiconductor layer through crystal growth from the crystal nuclei over a region including an upper surface of the mask layer.

In the first aspect of the invention, the mask layer can be formed as exposing part of the nitride semiconductor layer within the window region opened at part of the mask layer, and the exposed surface of the nitride semiconductor layer can be formed with irregularities within the window region. The irregularities act such that because of the discontinuity of the crystals formed at spaces established at the recessed portions of the irregularities, the through-type dislocations can be prevented from being propagated from the substrate side. The second nitride semiconductor layer is formed through crystal growth from the irregularities, and extends over a region including the upper surface of the mask layer. The growth over the region including the upper surface of the mask layer means crystal growth along lateral directions, thereby reliably preventing the propagation of through-type dislocations.

With the embodiments wherein a growth-impeding surface having fine pores is formed and wherein a crystal nucleus region serving as nuclei for crystal growth is formed, the crystals at the growth-impeding portion become discontinuous, or discontinuity with an underlying layer takes place due to the lateral direction growth extended from the periphery of crystal nuclei, so that the through-type dislocations from the substrate side can be prevented from propagation. Moreover, growth over a region including the upper surface of the mask layer means that crystals are grown in lateral directions, thereby permitting the through-type dislocations to be reliably prevented from propagation.

BRIEF DESCRIPTION OF THE DRAWINGS

FIGS. 1A to 1C are, respectively, schematic sectional views showing the steps of a crystal growth method according to a first embodiment of the invention wherein FIG. 1A shows the step of forming a GaN layer, FIG. 1B shows the step of forming a window region and FIG. 1C shows the step of forming irregularities;

FIGS. 2A to 2C are, respectively, schematic sectional views showing the steps of a crystal growth method subsequent to FIGS. 1A to 1C wherein FIG. 2A shows the step of forming a GaN layer, FIG. 2B shows the step of growing the GaN layer in lateral directions, and FIG. 2C shows the step of further growth of the GaN layer;

FIGS. 3A to 3C are, respectively, schematic sectional views showing the steps of a crystal growth method according to a second embodiment of the invention wherein FIG. 3A shows the step of forming a GaN layer, FIG. 3B shows the step of forming a window region, and FIG. 3C shows the step of forming a GaN layer by growth at a low temperature;

FIGS. 4A to 4C are, respectively, schematic sectional views showing the steps of the crystal growth method according to the second embodiment wherein FIG. 4A shows the step of forming a GaN layer, FIG. 4B shows the step of growing the GaN layer in lateral directions, and FIG. 4C shows the step of further growth of the GaN layer;

FIGS. 5A and 5B are, respectively, schematic sectional views showing the steps of a crystal growth method according to a third embodiment of the invention wherein FIG. 5A shows the step of forming a GaN layer, and FIG. 5B shows the step of forming a window region;

FIGS. 6A to 6C are, respectively, schematic sectional views showing the steps of the crystal growth method according to the third embodiment wherein FIG. 6A shows the step of forming a GaN layer, FIG. 6B shows the step of growing the GaN layer in lateral directions, and FIG. 4C shows the step of further growth of the GaN layer;

FIGS. 7A to 7C are, respectively, schematic sectional views showing the steps of a crystal growth method according to a fourth embodiment of the invention wherein FIG. 7A shows the step of forming a GaN layer, FIG. 7B shows the step of forming a window region and FIG. 7C shows the step of forming a growth-impeding surface;

FIGS. 8A to 8C are, respectively, schematic sectional views showing the steps of the crystal growth method according to the fourth embodiment of the invention wherein FIG. 8A shows the step of forming a GaN layer, FIG. 8B shows the step of growing the GaN layer in lateral directions, and FIG. 8C shows the step of further growth of the GaN layer;

FIGS. 9A to 9C are, respectively, schematic sectional views showing the steps of a crystal growth method according to a fifth embodiment of the invention wherein FIG. 9A shows the step of forming a GaN layer, FIG. 9B shows the step of forming a window region and FIG. 9C shows the step of etching the GaN layer; and FIGS. 10A to 10C are, respectively, schematic sectional views showing the steps of the crystal growth method according to the fifth embodiment of the invention wherein FIG. 10A shows the step of forming a GaN layer, FIG. 10B shows the step of growing the GaN layer in lateral directions, and FIG. 10C shows the step of further growth of the GaN layer.

PREFERRED EMBODIMENTS OF THE INVENTION

The crystal growth method of the invention comprises forming a first nitride semiconductor layer on a substrate, forming a mask layer, which is capable of impeding crystal growth and has a window region opened at part thereof, on the first nitride semiconductor layer in such a way that the first nitride semiconductor layer has irregularities at a surface portion thereof exposed at the window region, and growing a second nitride semiconductor layer through crystal growth from the irregularities over a region including an upper surface of the mask layer.

The substrate used in the invention is, for example, a sapphire substrate. As a matter of course, limitation is not placed on the use of a sapphire substrate that is generally employed for crystal growth of a nitride semiconductor, but other types of substrates or other types of nitride semiconductor substrates may be used.

The first nitride semiconductor layer is a first-layered nitride semiconductor layer formed on a substrate directly thereon or through a buffer layer. Such a nitride semiconductor layer may be formed, for example, of a gallium nitride (GaN) compound semiconductor, an aluminium nitride (AlN) compound semiconductor, an indium nitride (InN) compound semiconductor, an indium gallium nitride (InGaN) compound semiconductor or an aluminium gallium nitride (AlGaN) compound semiconductor, of which the gallium nitride compound semiconductor is preferred. More preferably, the first nitride semiconductor layer should have a Wurtzite-type crystal structure. It will be noted that in the practice of the invention, InGaN, AlGaN, GaN and the like do not always mean not only nitride semiconductors made of a ternary mixed crystal alone or a binary mixed crystal alone, but also those nitride semiconductors containing a very small amount of Al or other type of impurity, for example, with the case of InGaN, within a range where InGaN undergoes not change on its action. The term "first-layered or first layer" relatively means a layer that has been formed prior to the formation of a subsequently formed nitride semiconductor layer, not excluding the case where another nitride semiconductor layer may be formed prior to the formation of the first nitride semiconductor layer.

The first nitride semiconductor layer may be grown according to many vapor phase growth methods including, for example, a metal organic vapor phase epitaxial method (MOVPE method), a molecular beam epitaxial method (MBE method), a hydride vapor phase epitaxial method (HVPE method) or the like. When the MOVPE method is selected among them, there can be rapidly obtained a semiconductor layer with high crystallinity. In the MOVPE method, trialkyl metal compounds are frequently used including TMG (trimethyl gallium) or TEG (triethyl gallium) used for a Ga source, TMA (trimethyl aluminium) or TEA (triethyl aluminium) for an Al source, and TMI (trimethyl indium) or TEI (triethyl indium) for an In source. A gas such as ammonia, hydrazine or the like is used as a nitrogen source. The impurity sources include a silane gas for Si, a germanium gas for Ge, $Cp_2Mg$ (cyclopentadienyl magnesium) for Mg, DEZ (diethyl zinc) for Zn and the like. In the MOVPE method, these gases are fed to the surface of a substrate heated, for example, to 600° C. or over, and are decomposed to permit epitaxial growth of an InAlGaN compound semiconductor.

The mask layer used in the present invention is a layer that impedes crystal growth and is formed, for example, of a material such as silicon oxide, silicon nitride or the like. The film thickness can be selected depending on the size of a window region to be formed and the type of material for the nitride semiconductor layer, and is preferably within a rang of about 5 nm to about 50 nm, more preferably from about 10 nm to about 30 nm. This mask layer is formed with a window region of a desired size and shape. The window region may be single or plural in number and may be a combination of regions having different sizes and shapes. The window region may be shaped in the form of a band, a lattice, a circle, an oval, a regular square, a hexagon, a triangle, a rectangle, a rhomb, other polygons and modifications thereof. The opening of the window region may have an inclined face or faces such as a taper.

The first nitride semiconductor layer is exposed to through the window region of the mask layer, and the exposed portion of the first nitride semiconductor layer is formed with irregularities on the surface thereof. The irregularities have a plurality of valleys and peaks with a peak-to-valley level of 30 nm or over, preferably 100 nm or over, and are generally inclined with respect to the main surface of the substrate. If the peak-to-valley level or the difference between the peaks and the valleys is smaller than 30 nm, the irregularities may be undesirably buried upon epitaxial growth. If the peak-to-valley level of the irregularities is 100 nm or over, the yield of product can be kept high. The irregularities may be arranged regularly or randomly in shape. The irregularities may not always be formed within the first nitride semiconductor layer, but part of the substrate may be exposed to at valley portions of the irregularities. The inclined faces of individual irregularities should preferably be made of a crystal surface of the substrate or the first gallium nitride compound semiconductor, which has a reduced number of defects or damages.

Several methods of forming the irregularities may be mentioned including a method wherein the surface of the first nitride semiconductor layer is removed by dry etching or wet etching, and a method wherein a nitride semiconductor layer is formed by low temperature growth after the formation of the first nitride semiconductor layer or prior to the formation of the second nitride semiconductor layer. The formation of the irregularities and the formation of the mask layer may be reversed in order, i.e. the mask layer may be formed after the formation of the irregularities or the irregularities may be formed after the formation of the mask layer. The etching for the formation of the irregularities may be carried our in a growing apparatus of forming the first or second nitride semiconductor layer. In this case, these steps may be performed continuously. Alternatively, the irregularities may be formed by the combination of the formation methods of the irregularities set out hereinabove.

The second nitride semiconductor layer is one, which is grown through crystal growth of these irregularities over a region including the surface of the mask layer. In the window region, crystal growth starts from the inclined portions of the irregularities, so that the irregularities function to prevent the propagation of through-type dislocations from the side of the substrate due to the discontinuity of the crystals at space portions formed at the irregularities. This second nitride semiconductor layer grows over the mask layer serving as a protective film, so that the lateral growth is realized. At the portion where grown in lateral directions, the propagation of the through-type dislocation into the second nitride semiconductor layer can be prevented, thereby reducing the dislocation density in the second nitride semiconductor layer. More particularly, the nitride semiconductor crystals of a low dislocation density can be drastically formed not only over the opening where any mask layer is not formed, but also over the mask layer.

Spaces may be formed in a portion or portions where the through-type dislocations of the first nitride semiconductor layer exist by largely cutting off upon formation of the irregularities such as, for example, by etching. In order to form the spaces above the through-type dislocations, it is sufficient to selectively etch a through-type dislocation portion in a vapor or liquid phase. Where the second nitride semiconductor layer is formed by crystal growth, a recessed portion may be left above a through-type dislocation as a space, so that there can be readily provided such a structure that the through-type dislocation portion is terminated with the space.

Like the first nitride semiconductor layer, the second nitride semiconductor layer can be formed, for example, of a gallium nitride (GaN) compound semiconductor, an aluminium nitride (AlN) compound semiconductor, an indium nitride (InN) compound semiconductor, an indium gallium nitride (InGaN) compound semiconductor or an aluminium gallium nitride (AlGaN) compound semiconductor. Of these, the aluminium gallium nitride (AlGaN) compound semiconductor or the like nitride semiconductor is preferred. More preferably, the second nitride semiconductor layer should have a Wurtzite-type crystal structure, like the first nitride semiconductor layer. The second nitride semiconductor layer may be made of a material capable of being grown from the inclined face of the irregularities or the projected portions thereof in lateral directions. An instance of growth wherein growth in lateral directions can be realized includes an organic metal vapor phase growth method, but not limited to this method.

In the crystal growth method according to another embodiment of the invention, a growth-impeding surface having fine pores is formed in the surface of the first nitride semiconductor layer, and the second nitride semiconductor layer is grown through crystal growth from the fine pores over a region including the surface of the mask layer. This growth-impeding surface may have a structure made of a thin film of silicon oxide or silicon nitride, and the crystal growth from the fine pores, such as small pinholes, commences in the form of islands. Where the crystal growth is subsequently continued, the growth-impeding surface functions to stop the through-type dislocations. Thus, the second nitride semiconductor layer is formed as a semiconductor crystal layer having a low dislocation density and excellent crystallinity.

In the crystal growth method according to a further embodiment of the invention, a crystal nucleus region serving as nuclei of crystal growth is formed on the surface of the first nitride semiconductor layer within the window region, and the second nitride semiconductor layer is grown over a region including the surface of the mask layer through crystal growth from the crystal nuclei formed in the crystal nucleus region.

When a nitride semiconductor layer is grown after formation of irregularities or the like at a region where no protective layer is formed as in the present invention, it becomes possible to form a nitride semiconductor layer having a dislocation density lower than in prior art. Accordingly, using the crystal growth method of the invention, semiconductor devices of a high performance such as semiconductive light-emitting devices using a builtup structure such as of a gallium nitride compound semiconductor or the like can be readily realized.

First Embodiment

Figure 1A:
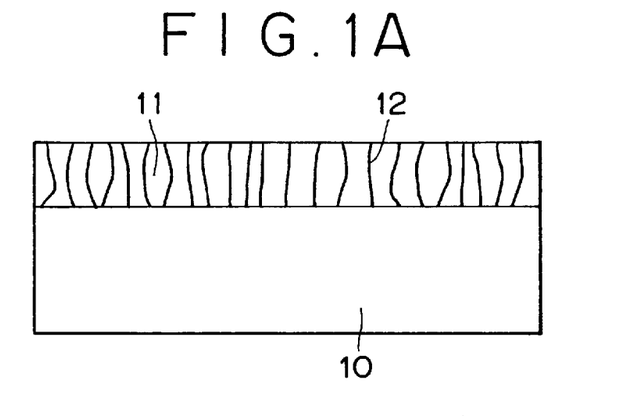

The first embodiment of the invention is now described with reference to FIGS. 1A to 1C and FIGS. 2A to 2C. Initially, as shown in FIG. 1A, an about 2 µm thick epitaxial GaN layer 21 is grown as a first nitride semiconductor layer on a C face sapphire substrate 10 wherein the main surface of the substrate is a C+ face. Through-type dislocations 12 exist in the GaN layer 11 at a density of about $3\times10^9$ cm$^{-2}$ ascribed to the lattice-mismatching and the difference in coefficient of thermal expansion with the sapphire substrate 10.

Figure 1B:
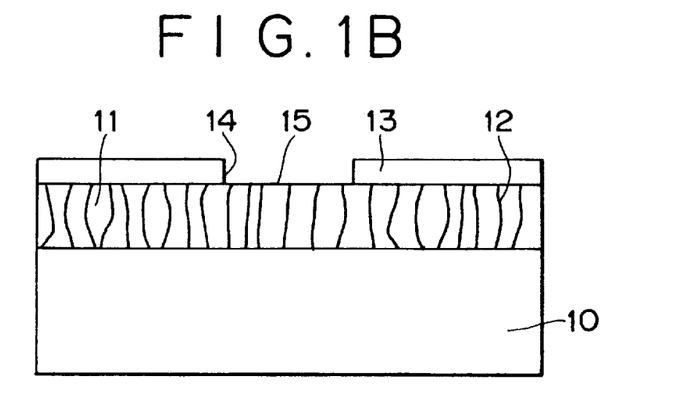

Next, as shown in FIG. 1B, a mask layer 13 made of $SiO_2$ is formed on the GaN layer 11. The mask layer 13 made of $SiO_2$ has a thickness of about 20 nm. A window region 14 opened in the mask layer 13 according to a lithographic technique is formed. A surface 15 of the GaN layer 11 provided beneath the mask layer 13 is exposed to within the window region 14 formed by opening part of the mask layer 13 in a manner as set out above.

Figure 1C:
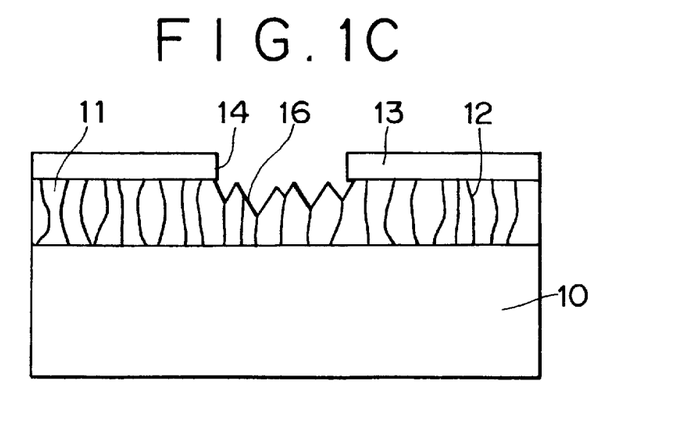

After the formation of the window region 14, the wafer-shaped sapphire substrate 10 is placed in an organic metal vapor phase growth apparatus wherein while passing ammonia used as a starting material for nitrogen and hydrogen and nitrogen serving as a carrier gas, the apparatus is heated to 1020° C. for 3 minutes. By the heating, the window region 14 where no protective film has been formed is etched mainly by the action of heat and hydrogen, thereby forming pits or valleys with a depth of approximately 100 nm to form irregularities 16 as shown in FIG. 1C. Especially, the through-type dislocations 12 of the original GaN layer 11 are more likely to be etched, so that the pits or valleys are located just above the through-type dislocations 12, respectively. This pit is in the form of an inverted hexagonal pyramid consisting of six S faces ((1, −1, 0, 1) faces).

Figure 2A:
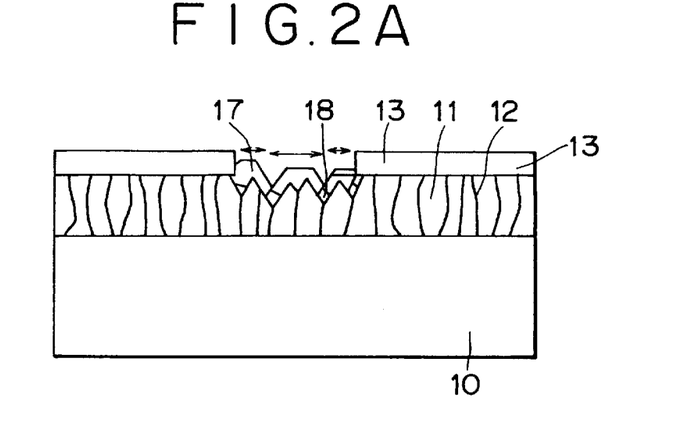

When trimethyl gallium used as a starting material for Ga is fed to the apparatus at such a temperature as indicated above, a GaN layer 17 starts to be grown in lateral directions from the inclined surfaces of the pits of the irregularities 16 within the window region 14 as is particularly shown in FIG. 2A, thereby causing the crystals of the GaN layer 17 serving as a second nitride semiconductor layer to be grown. The through-type dislocations 12 existing at the bottom of the pits are intercepted owing to the lateral growth from the inclined faces and are not propagated upwardly. Especially, when the growth temperature is at 1000° C. or over at which the growth rate in lateral directions is high, the throughtype dislocation 12 terminates at a space portion 18 that is free of crystals, and the through-type dislocation 12 does not further propagate at a portion higher than the space portion 18.

Figure 2B:
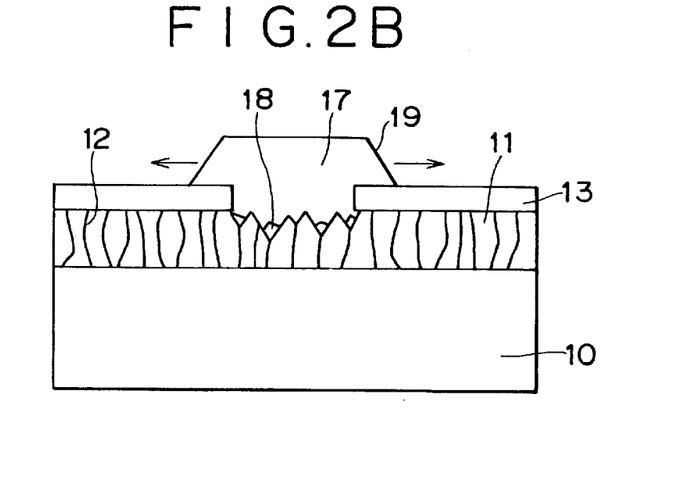
Figure 2C:
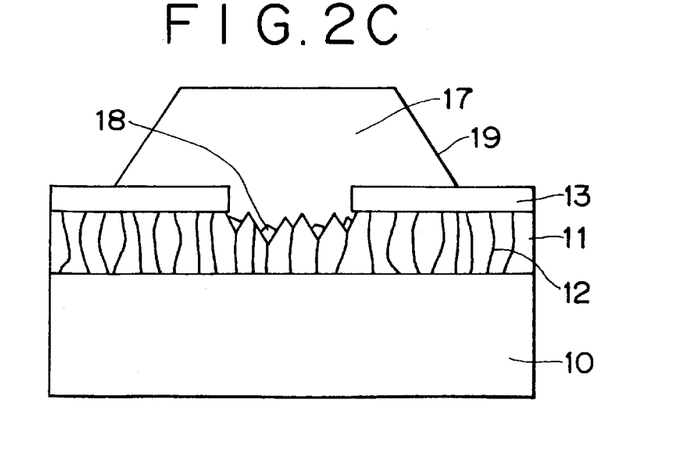

If the growth is further continued, the crystals of the GaN layer 17 grown from individual inclined faces mutually associate with one another as shown in FIG. 2B. At this point, although the GaN layer 17 is grown over the window region of the mask layer 13 where any protective film is not formed, crystals having a low through-type dislocation density can be formed.

When the growth is still further continued, an inclined face 19 extends so that the GaN layer 17 is grown in lateral directions over the mask layer 13. In these regions, the through-type dislocation 12 extending vertically from the substrate is intercepted by means of the mask layer 13. Thus, little dislocation takes place fundamentally (see FIG. 2C). Eventually, there can be formed the GaN layer 17 having a very low dislocation density on or over the mask layer 13 and also on the window region 14 where no mask layer 13 is formed.

In this embodiment, the irregularities 16 such as pits having a depth of about 100 nm are formed in the window region 14 mainly by application of heat and etching with hydrogen in the organic metal vapor phase growth apparatus. The recessed or valley portions of the irregularities 16, respectively, correspond to positions at which the through-type dislocations 12 are located. Where the GaN layer 17 is formed subsequently, the space portion 18 serve to prevent the propagation of the through-type dislocation 12. Accordingly, there can be obtained not only the effect of reducing the number of the through-type dislocations 12 owing to the lateral growth, but also very high-quality crystals.

Second Embodiment

Figure 3A:
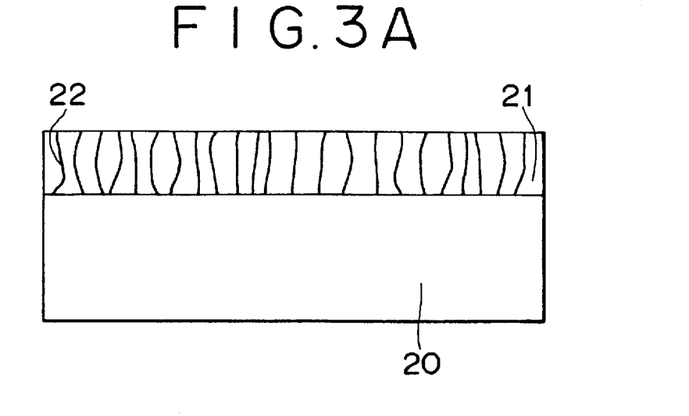

The crystal growth method according to the second embodiment of the invention is described with reference to FIGS. 3A to 3C and FIGS. 4A to 4C. Like the first embodiment, as shown in FIG. 3A, an about 2 µm thick epitaxial GaN layer 21 is grown as a first nitride semiconductor layer on a C face sapphire substrate 20 wherein the main surface of the substrate is a C+ face. Through-type dislocations 22 exist in the GaN layer 21 at a density of about $3\times10^9$ cm$^{-2}$ ascribed to the lattice-mismatching and the difference in coefficient of thermal expansion with the sapphire substrate 20.

Figure 3B:
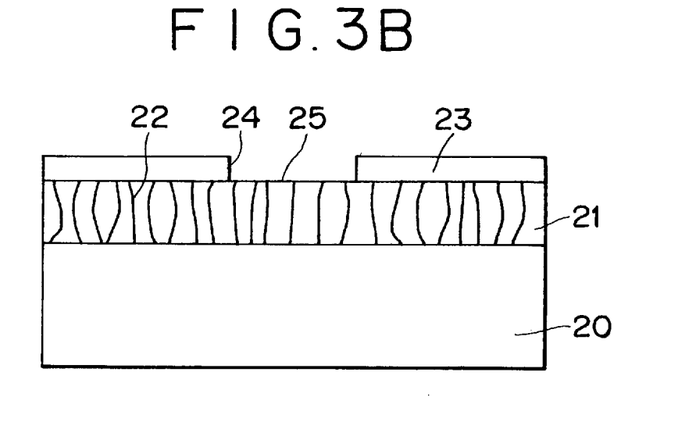

Next, as shown in FIG. 3B, a mask layer 23 made of $SiO_2$ is formed on the GaN layer 21. The mask layer 23 made of $SiO_2$ has a thickness of about 20 nm. A window region 24 opened in the mask layer 23 according to a lithographic technique is formed. A surface 25 of the GaN layer 21 provided beneath the mask layer 23 is exposed to within the window region 24 formed by opening part of the mask layer 23 in a manner as set out above.

Figure 3C:
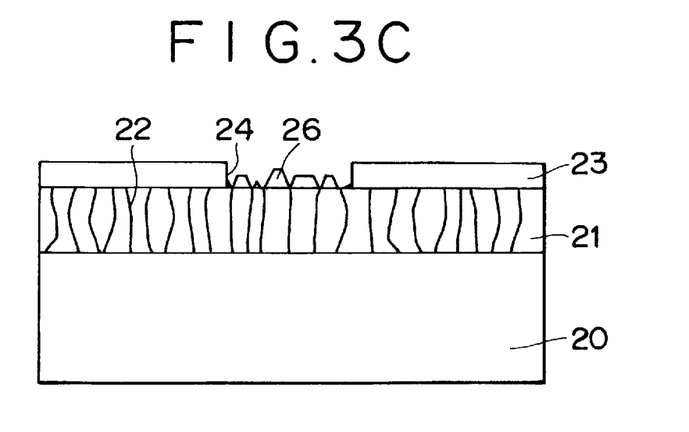

After the formation of the window region 24, the wafer-shaped sapphire substrate 20 is placed in an organic metal vapor phase growth apparatus wherein while passing ammonia used as a starting material for nitrogen and hydrogen and nitrogen serving as a carrier gas, the apparatus is heated to 850° C., trimethyl gallium serving as a starting material for Ga starts to be fed thereinto. As a result, a low temperature growth GaN layer 26 is grown in the form of irregularities to form irregularity portions. In general, with the low temperature growth at a temperature of 1000° C. or below by an organic metal vapor phase growth method, the irregularities can be relatively readily formed from the through-type dislocations 22 serving as growth pits.

Figure 4A:
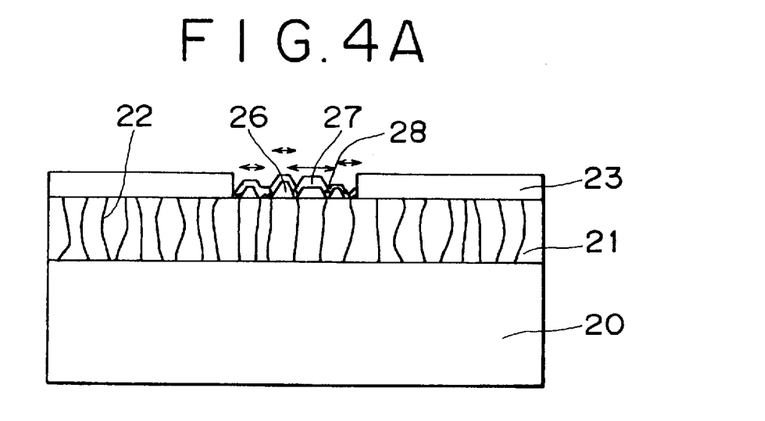

While continuing the feed of trimethyl gallium to the same growth apparatus, the temperature is further raised to 1020° C., whereupon as shown in FIG. 4A, rapid lateral growth of the low temperature growth GaN layer having the irregularities starts from the inclined surfaces of the layer 26. This lateral growth permits a GaN layer 27 to be formed as a second nitride semiconductor layer wherein a space portion 28 may be partly formed in correspondence to an upper end portion of the through-type dislocation 22. The through-type dislocation 22 does not propagate from the underlying GaN layer 21 toward the GaN layer 27, grown at 1020° C., owing to the lateral growth and also the existence of the through-type dislocation 22 at the bottom of a pit where the space portion 28 is present.

Figure 4B:
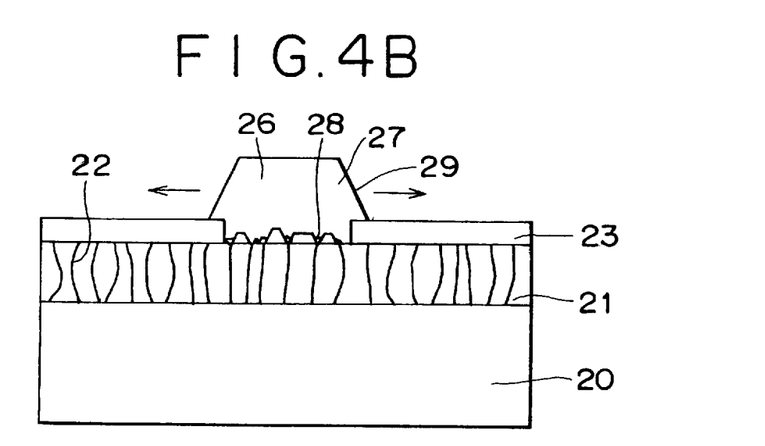
Figure 4C:
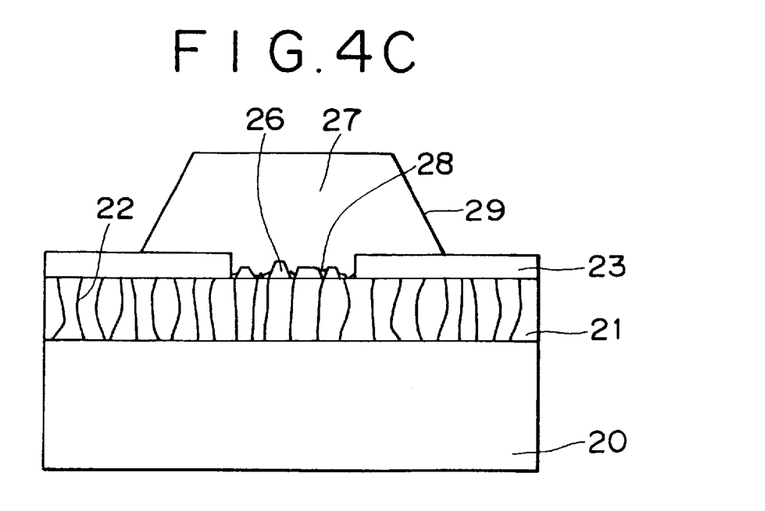

When such growth is continued, as shown in FIG. 4B, an inclined portion 29 of the GaN layer 27 is spread as extending over the mask layer 23, so that in spite of the growth from the window region 24 where no mask layer 23 is formed, there can be formed crystals having a low through-type dislocation density. If further growth is continued, satisfactory lateral growth on or over the mask layer 23 is realized, so that the through-type dislocation 22 extending vertically from the side of the substrate 20 is intercepted by means of the mask layer 23 in these regions, and thus, little dislocation fundamentally takes place (FIG. 4C).

As will be seen from the above, the crystal growth from the low temperature growth GaN layer 26 permits the GaN layer 27 of a very low dislocation density to be formed on both the mask layer 23 and the window region 24 where no mask is formed.

In this embodiment, the low temperature growth GaN layer 26 is initially formed in the organic metal vapor phase growth apparatus, and the GaN layer 27 serving as a second nitride semiconductor layer can be formed using the same apparatus and gas as used above by a continuous operation with the temperature being raised. The low temperature growth GaN layer 26 is formed with irregularities where the pit portions correspond in position to the through-type dislocations 22, respectively. Where the GaN layer 27 is continuedly formed, the space portions 28 function to impede the propagation of the through-type dislocations 22. Accordingly, very high-quality crystal can be obtained along with the good effect of reducing the number of the through-type dislocations 22 due to the lateral growth.

Third Embodiment

Next, the third embodiment of the invention is described with reference to FIGS. 5A and 5B, and FIGS. 6A to 6C. The crystal growth method of this embodiment is a modification of the crystal growth method of the second embodiment wherein when a first nitride semiconductor layer has been preliminarily grown on a sapphire substrate, a low temperature growth layer is finally formed to make an irregular surface, after which a mask layer is formed.

Figure 5A:
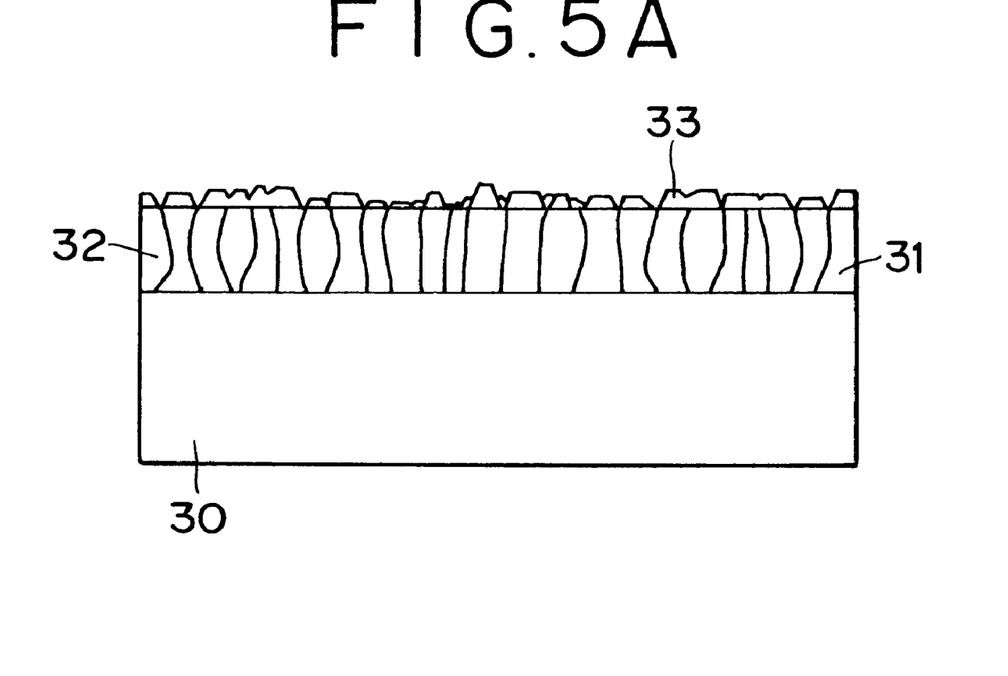

Like the first or second embodiment, as shown in FIG. 5A, an about 2 $\mu$m thick epitaxial GaN layer 31 is grown as a first nitride semiconductor layer on a C face sapphire substrate 30 wherein the main surface of the substrate is a C+ face. Through-type dislocations 32 exist in the GaN layer 31 at a density of about $3 \times 10^9$ cm$^{-2}$ ascribed to the lattice-mismatching and the difference in coefficient of thermal expansion with the sapphire substrate 30.

Next, prior to formation of a mask layer, a low temperature growth GaN layer 33 having irregularities in the surface thereof is formed by growth at a low temperature. The method of forming this low temperature growth GaN layer 33 is performed such that like the second embodiment, the wafer per se is placed in an organic metal vapor phase apparatus. Thereafter, while passing ammonia used as a starting material for nitrogen and hydrogen and nitrogen serving as a carrier gas, the apparatus is heated to 850° C., under which triethyl gallium is fed, thereby forming a low temperature growth GaN layer 33 over the entire surface of the GaN layer 31 as having irregularities. In general, with the low temperature growth at 1000° C. or below by the organic metal vapor phase growth method, the irregularities wherein the through-type dislocations 32 serve as growing pits are relatively readily formed. These epitaxial GaN layer 31 and the low temperature growth GaN layer 33 may be formed, for example, by use of the same organic metal vapor phase growth apparatus wherein relatively easy formation is ensured while using the same type of starting gas and lowering the temperature.

Figure 5B:
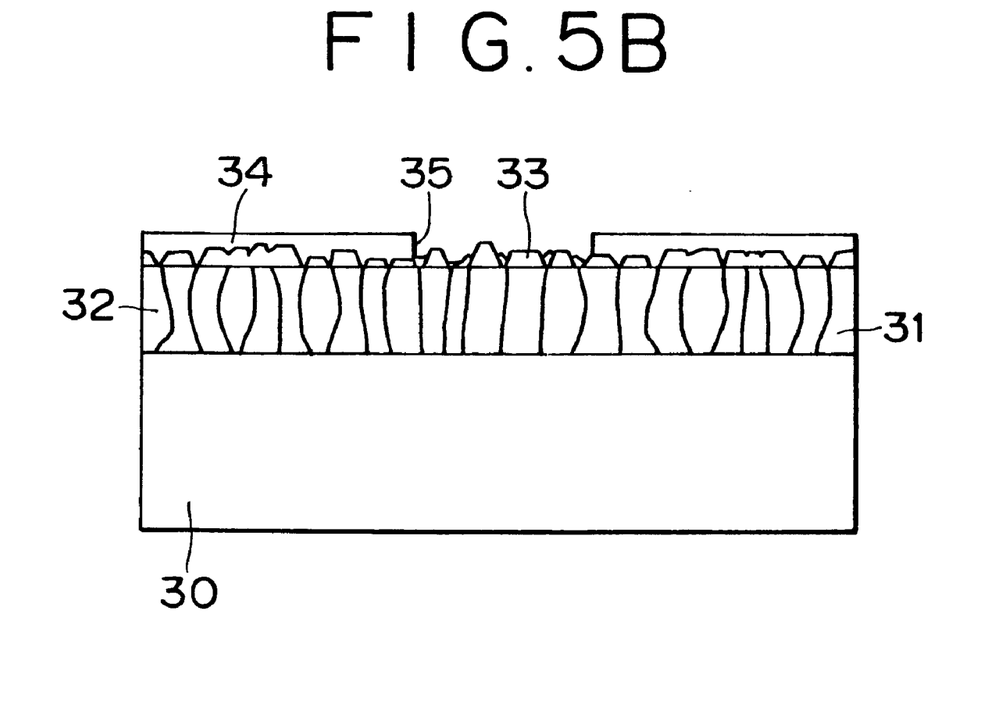

Next, as shown is FIG. 5B, a mask layer 34 made of SiO$_2$ is formed on or over these GaN layer 31 and the low temperature growth GaN layer 33. The mask layer 34 made of SiO$_2$ has a thickness of about 20 nm. This mask layer 34 is formed with a window region 35 opened according to a lithographic technique. The low temperature growth GaN layer 33 having the irregularities formed beforehand stands exposed to within the window region 35 formed by opening part of the mask layer 34, along with the surface of the underlying GaN layer 31 beneath the mask layer 34.

Figure 6A:
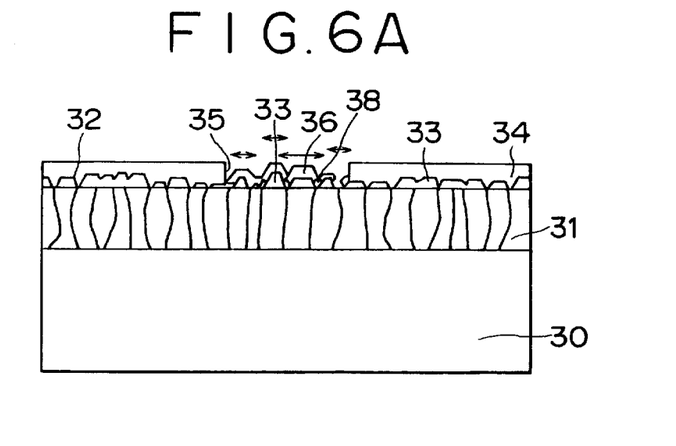

After the formation of the window region 35, while feeding trimethyl gallium to the growth apparatus, the temperature is raised to 1020° C., whereupon as shown in FIG. 6A, rapid lateral growth starts from the inclined surfaces of the low temperature growth GaN layer 33 having the irregularities. By the lateral growth, a GaN layer 36 serving as a second nitride semiconductor layer is formed with the possibility that a space portions 38 is partly formed corresponding to an upper end portion of the through-type dislocation 32. The through-type dislocation 32 does not propagate from the underlying GaN layer 31 toward the GaN layer 36 grown at 1020° C. due to the lateral growth and the existence of the through-type dislocation 32 at the bottom of the space portion 38.

Figure 6B:
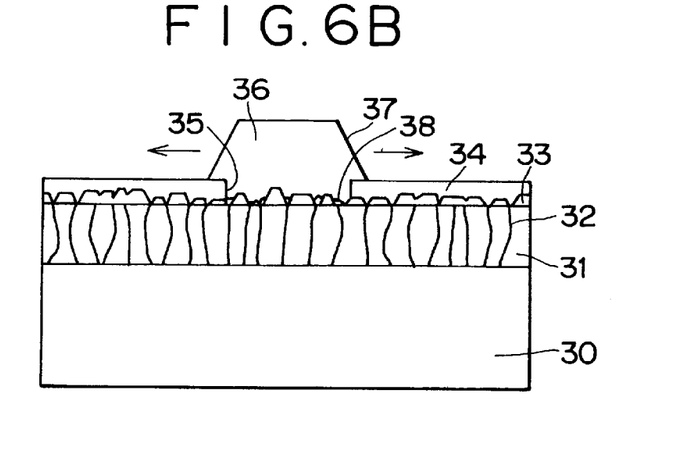
Figure 6C:
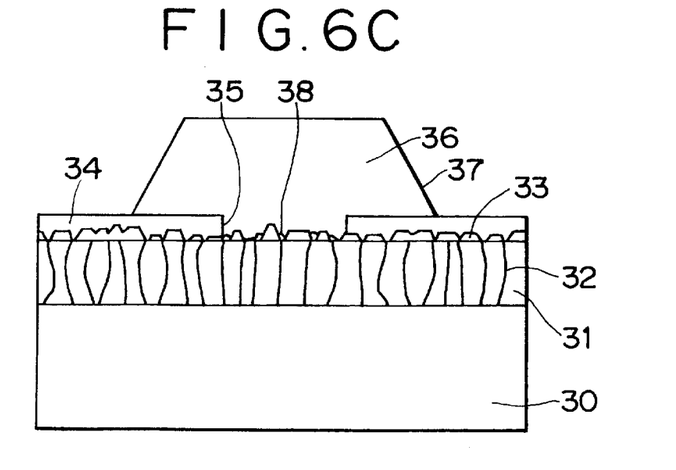

When such growth is continued, as shown in FIG. 6B, the portion of the inclined surface of the GaN layer 36 is spread as extending over the mask layer 34. In spite of the growth from the window region 35 where no mask layer is formed, the resultant crystals have a low through-type dislocation density. If further growth is continued, the crystals grow laterally over the mask layer 34 to a satisfactory extent, so that the through-type dislocations 32 extending vertically from the side of the sapphire substrate 30 are reliably intercepted with the mask layer 34 in these regions. Thus, little dislocation fundamentally takes place (FIG. 6C).

According to the crystal growth from the low temperature growth GaN layer 26 formed prior to the formation of the mask layer 34, there can also be formed the GaN layer 36 having a very low dislocation density both on the mask layer 34 and on the window region 35 opened at the mask layer 34.

In this embodiment, the mask layer 34 is formed after the formation of the low temperature growth GaN layer 33 to make irregular surfaces in the course of the growth of the GaN layer 31 serving as the first nitride semiconductor layer on the sapphire substrate 30. The low temperature growth GaN layer 33 has irregularities whose pit portions correspond in position to the through-type dislocations 32. Where the GaN layer 36 serving as the second nitride semiconductor layer is subsequently formed, the space portions 38 function to impede the propagation of the through-type dislocations 32. Accordingly, very high-quality crystals can be obtained along with the good effect of reducing the number of the through-type dislocations 32 owing to the lateral growth.

Fourth Embodiment

The crystal growth method according to the fourth embodiment of the invention is described with reference to FIGS. 7A to 7C and 8A to 8C. In this embodiment, a growth-impeding surface capable of impeding crystal growth is formed over a window region opened at a mask layer, and irregularities are formed through crystal growth from fine pores in the growth-impeding surface.

Figure 7A:
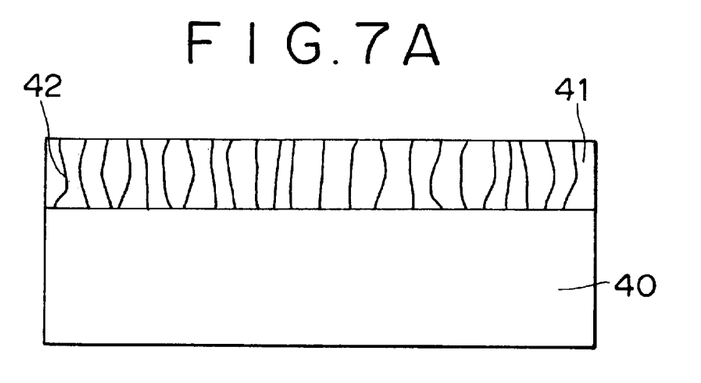

As shown in FIG. 7A, an about 2 $\mu$m thick epitaxial GaN layer 41 is grown as a first nitride semiconductor layer on a C face sapphire substrate 40 wherein the main surface of the substrate is a C+ face. Through-type dislocations 42 exist in the GaN layer 41 at a density of about $3\times10^9$ cm$^{-2}$ ascribed to the lattice-mismatching and the difference in coefficient of thermal expansion with the sapphire substrate 40.

Figure 7B:
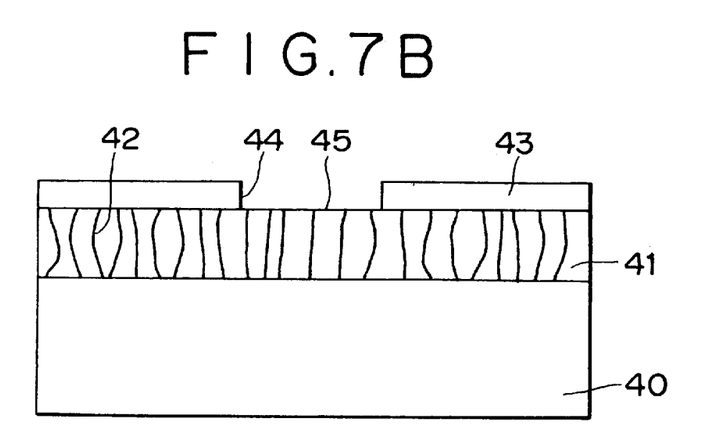
Figure 7C:
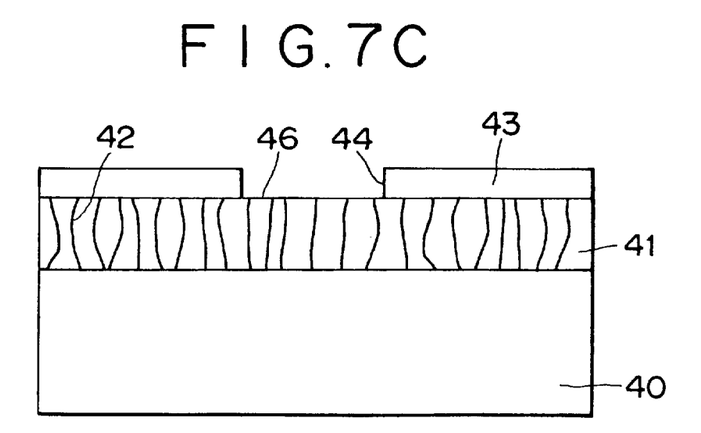

Next, as shown is FIG. 7B, a mask layer 43 made of SiO$_2$ is formed on or over this GaN layer 41. The mask layer 43 made of SiO$_2$ has a thickness of about 20 nm. This mask layer 43 is formed with a window region 44 opened according to a lithographic technique. The GaN layer 41 beneath the mask layer 43 stands exposed to at a surface 45 thereof within the window region 44 formed by opening part of the mask layer 43.

After the formation of the window region 44 at the mask layer 43, the wafer is placed in an organic metal vapor phase growth apparatus wherein while passing ammonia as a starting material for nitrogen and hydrogen and nitrogen as a carrier gas, the temperature is raised. Five minutes after the feed of a silane gas serving as a starting material for silicon, trimethyl gallium serving as a starting material for Ga starts to be fed at 1020° C. In general, it is known that silicon acts as an antisurfactant that impedes the crystal growth of a gallium nitride compound semiconductor. After the feed of the silane gas, the surface of the GaN layer 41 within the window region 44 opened at the mask layer 43 is terminated with a compound such as SiN$_x$. Thus, the surface of the GaN layer 41 is covered with a growth-impeding surface 46 made mainly of silicon nitride as is particularly shown in FIG. 7C. GaN undergoes little growth on this growth impeding surface 46, and the growth impeding surface 46 is formed with fine pores (or pinholes) at quite a part thereof.

Figure 8A:
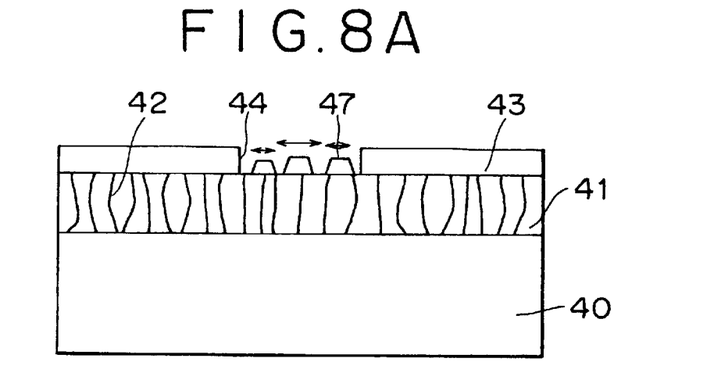
Figure 8B:
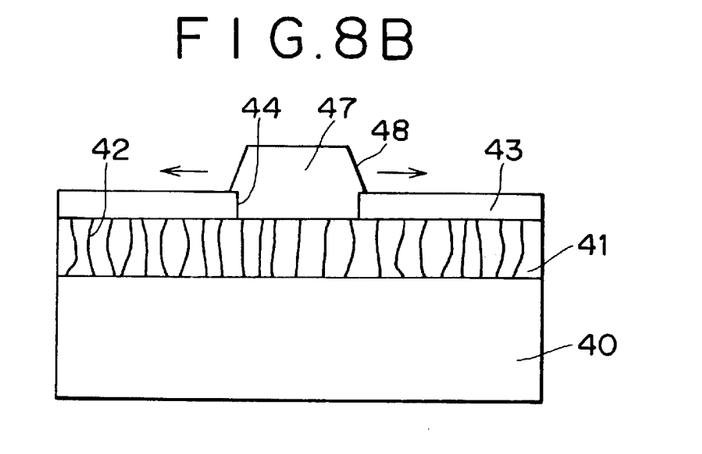
Figure 8C:
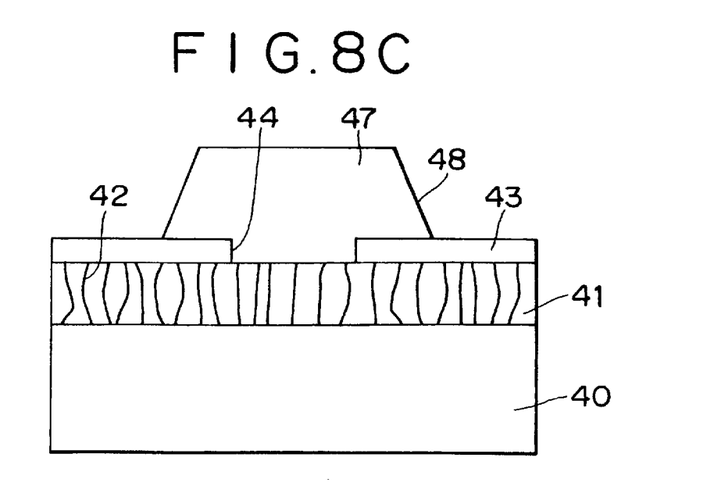

For the growth of GaN, growth commences from portions, where the fine pores exist in the growth impeding surface 46, in the form of islands, thereby forming a GaN layer 47 having irregularities as shown in FIG. 8A. As further growth proceeds, the portion of an inclined surface of the GaN layer 47 is spread as extending over the mask layer 43 as shown in FIG. 8B. In spite of the growth from the window region 44 where no mask layer 43 is formed, crystals having a low through-type dislocation density can be formed. Still further growth permits lateral growth over the mask layer 43 to a satisfactory extent, so that the through-type dislocation 42 extending vertically from the side of the sapphire substrate 40 is reliably intercepted in these region, and little dislocation fundamentally takes place (see FIG. 8C).

In the crystal growth method of this embodiment, the GaN layer 47 having a very low dislocation density can be formed on or over the mask layer 43 and the window region 44 where no mask layer is formed according to the steps set out hereinabove. It will be noted that in the crystal growth method of this embodiment, the surface is rendered irregular by feed of a material capable of impeding the growth, and the reverse may be case where a starting material serving as nuclei of promoting the growth may be fed to form irregularities so far as the surface can be rendered irregular. In this embodiment, although the growth of the growth-impeding surface 46 having fine pores is performed after the formation of the window region 44 opened at the mask layer 43, the growth impeding surface 46 having such fine pores may be formed prior to the formation of the mask layer 43.

Fifth Embodiment

The crystal growth method according to the fifth embodiment of the invention is described with reference to FIGS. 9A to 9C and 10A to 10C. In this embodiment, irregularities are formed according to reactive ion etching in a window region opened at a mask layer, and a GaN layer is formed from the irregularities by crystal growth.

Figure 9A:
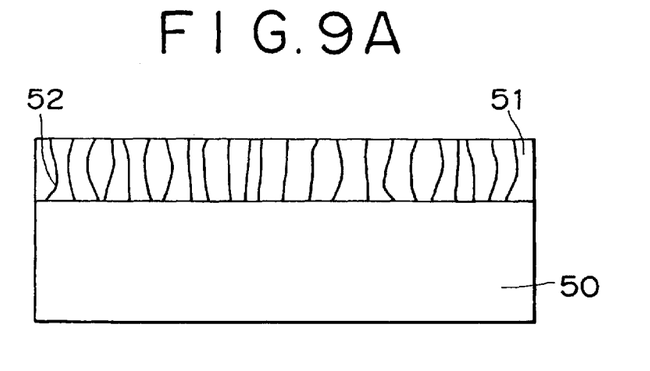

As shown in FIG. 9A, an about 2 μm thick epitaxial GaN layer 51 is grown as a first nitride semiconductor layer on a C face sapphire substrate 50 wherein the main surface of the substrate is a C+ face. Through-type dislocations 52 exist in the GaN layer 51 at a density of about $3\times10^9$ cm$^{-2}$ ascribed to the lattice-mismatching and the difference in coefficient of thermal expansion with the sapphire substrate 50.

Figure 9B:
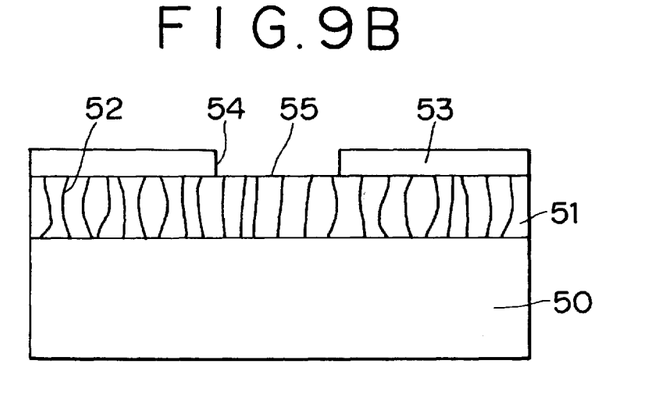

Next, as shown is FIG. 9B, a mask layer 53 made of SiO$_2$ is formed on or over this GaN layer 51. The mask layer 53 made of SiO$_2$ has a thickness of about 20 nm. This mask layer 53 is formed with a window region 54 opened according to a lithographic technique. The GaN layer 51 beneath the mask layer 53 stands exposed to at a surface 55 thereof within the window region 54 formed by opening part of the mask layer 53.

Figure 9C:
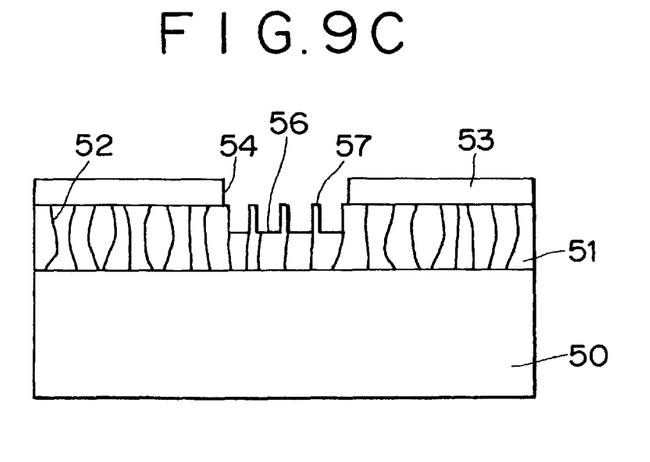

The surface 55 of the GaN layer 51 within the window region 54 where no mask layer 53 is formed is subjected to reactive ion etching to process the surface as having irregularities as shown in FIG. 9C. The irregularities are so shaped as to include valley or recessed portions 56 and projections 57 extending from the recessed portions substantially vertically, but not limited thereto. As an instance, the depth of the recessed portion is 30 nm or over, preferably 100 nm or over. In this embodiment, the order of the formation of the mask layer 53 used as an SiO$_2$ protective film and the processing of the GaN layer 51 by reactive ion etching may be reversed.

Figure 10A:
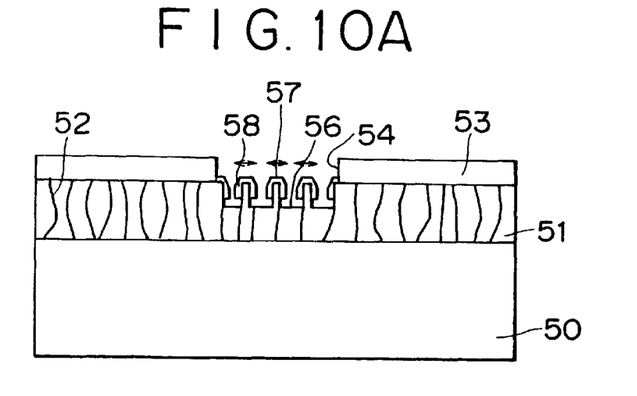

The resultant wafer shown in FIG. 9C is placed in an organic metal vapor phase growth apparatus. While passing ammonia used as a starting material for nitrogen and hydrogen and nitrogen as a carrier gas, the temperature is raised and trimethyl gallium is fed to at 1020° C. When growth is continued for a while, lateral growth from the projections 57 starts where crystals grow to cover the upper end sides of individual projections to form GaN layers 58 as shown in FIG. 10A. Because of the crystal growth at the upper end sides of the projections 57, the recessed portions 56 serve as a space portion as they are, and function to intercept the through-type dislocations 52.

Figure 10B:
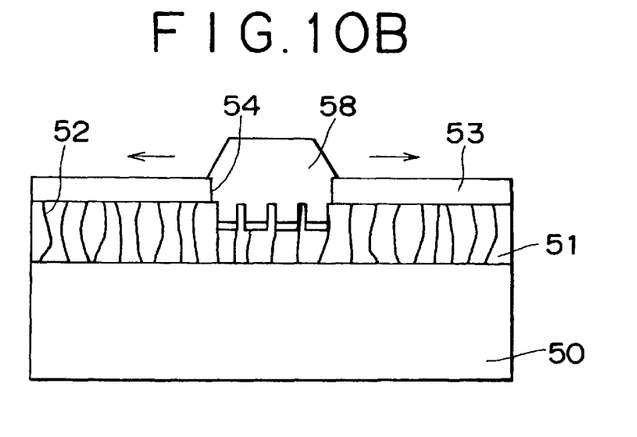
Figure 10C:
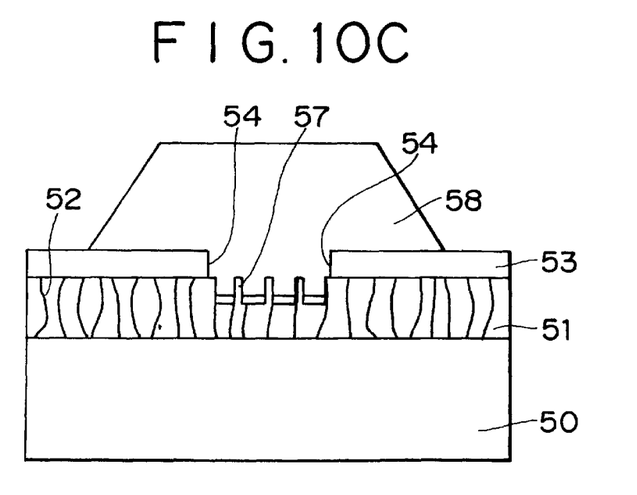

When further growth is continued, the lateral growth proceeds so that the GaN layers 58 at individual projections 57 are combined with one another as shown in FIG. 10B. When still further growth is continued, the GaN layer 58 is laterally grown over the mask layer 53 as shown in FIG. 10C. In these region, little dislocation extending vertically from the substrate takes place due to the presence of the protective film.

In this embodiment, after the formation of the window region 54, the irregularities having the about 100 nm deep recessed portions 56 and the projections 57 are formed by reactive ion etching. The recessed portion of the irregularities is left as a space portion after the crystal growth, and the space portion functions to impede the propagation of the through-type dislocations 52. Accordingly, very high-quality crystals can be obtained along with the good effect of reducing the number of dislocations 52 due to the lateral growth.

While preferred embodiments of the present invention have been described using specific terms, such description is for illustrative purposes only, and it is to be understood that changes and variations may be made without departing from the spirit or scope of the following claims.

What is claimed is:

1. A crystal growth method, comprising the steps of:
   forming a first nitride semiconductor layer on a substrate;
   forming a mask layer, which is capable of impeding crystal growth and has a window region opened at part thereof, on said first nitride semiconductor layer in such a way that said first nitride semiconductor layer has irregularities at a surface portion thereof exposed at said window region; and growing a second nitride semiconductor layer through crystal growth from the irregularities over a region including the upper surface of the mask layer.

2. A crystal growth method according to claim 1, wherein said irregularities have a peak-to-valley level of at least 30 nm or over.

3. A crystal growth method according to claim 1, wherein said irregularities are formed etching.

4. A crystal growth method according to claim 3, wherein the etching is performed at a temperature of 800° C. or over.

5. A crystal growth method according to claim 1, wherein said irregularities are formed by reactive ion etching.

6. A crystal growth method according to claim 1, wherein through-type dislocations existing in said first nitride semiconductor layer are terminated at spaces established in the irregularities.

7. A crystal growth method according to claim 1, wherein said irregularities are formed by crystal growth of a nitride semiconductor.

8. A crystal growth method according to claim 7, wherein said nitride semiconductor for forming the irregularities is grown through low temperature growth at 1000° C. or below.

9. A crystal growth method according to claim 7, wherein the crystal growth of said nitride semiconductor for forming said irregularities is performed prior to the formation of the mask layer.

10. A crystal growth method according to claim 7, wherein the crystal growth of said nitride semiconductor for forming said irregularities is performed after the formation of the mask layer.

11. A crystal growth method, comprising the steps of:

forming a first nitride semiconductor layer over or on a substrate;

forming a mask layer, which is capable of impeding crystal growth and has a window region opened at part thereof, on said first nitride semiconductor layer in such a way that said first nitride semiconductor layer has a growth-impeding surface that has fine pores at a surface portion thereof exposed at the window region; and growing a second nitride semiconductor layer through crystal growth from the fine pores over a region including an upper surface of said mask layer.

12. A crystal growth method, comprising the steps of:

forming a first nitride semiconductor layer over or on a substrate;

forming a mask layer, which is capable of impeding crystal growth and has a window region opened at part thereof, on said first nitride semiconductor layer in such a way that said first nitride semiconductor layer has a crystal nucleus region serving as crystal nuclei for crystal growth at a surface portion thereof exposed at the window region; and growing a second nitride semiconductor layer through crystal growth from the crystal nuclei over a region including an upper surface of the mask layer.

* * * * *